(12) United States Patent
Jansen et al.

(10) Patent No.: US 11,556,066 B2
(45) Date of Patent: Jan. 17, 2023

(54) STAGE SYSTEM AND LITHOGRAPHIC APPARATUS

(71) Applicant: ASML Netherlands B.V., Veldhoven (NL)

(72) Inventors: Maarten Jozef Jansen, Casteren (NL); Frank Auer, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/434,309

(22) PCT Filed: Jan. 30, 2020

(86) PCT No.: PCT/EP2020/052244
§ 371 (c)(1),
(2) Date: Aug. 26, 2021

(87) PCT Pub. No.: WO2020/173652
PCT Pub. Date: Sep. 3, 2020

(65) Prior Publication Data
US 2022/0137517 A1 May 5, 2022

(30) Foreign Application Priority Data
Feb. 28, 2019 (EP) .................................. 19159972

(51) Int. Cl.
*G03F 7/20* (2006.01)
(52) U.S. Cl.
CPC ........ *G03F 7/7085* (2013.01); *G03F 7/70775* (2013.01)
(58) Field of Classification Search
CPC ........................... G03F 7/70775; G03F 7/7085
See application file for complete search history.

(56) References Cited

U.S. PATENT DOCUMENTS

| 4,613,200 A | 9/1986 | Hartman |
| 6,020,964 A | 2/2000 | Loopstra et al. |

(Continued)

FOREIGN PATENT DOCUMENTS

| JP | S61-035416 A | 2/1986 |
| JP | H11-241909 A | 9/1999 |

(Continued)

OTHER PUBLICATIONS

International Search Report and Written Opinion of the International Searching Authority directed to related International Patent Application No. PCT/EP2020/052244, dated Apr. 20, 2020; 10 pages.

(Continued)

*Primary Examiner* — Deoram Persaud
(74) *Attorney, Agent, or Firm* — Sterne, Kessler, Goldstein & Fox P.L.L.C.

(57) ABSTRACT

The invention provides a stage system comprising a stage (ST) which is movable in respect of a reference structure. One of the stage and the reference structure comprises a reflective surface (REFS). An optical position sensor (IF1) is arranged at the other one of the stage and the reference structure and is configured to determine a position of the reflective surface relative to the optical position sensor. An optical shape sensor (IF2) is configured to determine a shape of the reflective surface. The stage system further comprises a position measurement controller configured to derive a stage position of the stage from the position of the reflective surface relative to the optical position sensor and from the shape of the reflective surface as determined by the optical shape sensor.

18 Claims, 7 Drawing Sheets

(56) References Cited

U.S. PATENT DOCUMENTS

| | | | |
|---|---|---|---|
| 6,486,955 B1 | 11/2002 | Nishi | |
| 6,888,638 B1 * | 5/2005 | Hill | G01B 9/02003 356/508 |
| 6,952,253 B2 | 10/2005 | Lof et al. | |
| 7,489,407 B2 * | 2/2009 | Hill | G03F 7/70775 356/508 |
| 9,188,424 B2 * | 11/2015 | Holzapfel | G01B 9/02059 |
| 2001/0035959 A1 | 11/2001 | Hill | |
| 2004/0135980 A1 | 7/2004 | Hill | |
| 2005/0151951 A1 | 7/2005 | Hill | |
| 2005/0185193 A1 | 8/2005 | Schluchter et al. | |
| 2006/0170892 A1 * | 8/2006 | Koenen | G03F 9/7011 355/53 |
| 2006/0215173 A1 | 9/2006 | Hill et al. | |
| 2007/0058146 A1 | 3/2007 | Yamaguchi | |
| 2007/0058173 A1 | 3/2007 | Holzapel | |
| 2009/0051894 A1 | 2/2009 | Shibazaki et al. | |
| 2009/0122287 A1 | 5/2009 | Kanaya | |
| 2011/0058149 A1 * | 3/2011 | Shibazaki | G03F 7/70666 355/77 |
| 2012/0327386 A1 | 12/2012 | Huang et al. | |
| 2013/0050675 A1 | 2/2013 | Jansen et al. | |
| 2014/0125962 A1 | 5/2014 | Hamaya et al. | |
| 2022/0113127 A1 * | 4/2022 | Oeguen | G01B 11/14 |

FOREIGN PATENT DOCUMENTS

| | | |
|---|---|---|
| JP | 2005-233966 A | 9/2005 |
| JP | 2006-073798 A | 3/2006 |
| JP | 2009-206203 A | 9/2009 |
| JP | 2014-096456 A | 5/2014 |
| JP | 5517071 B2 | 6/2014 |
| JP | 2016-054232 A | 4/2016 |
| JP | 2017-183298 A | 10/2017 |
| WO | WO 2013/188547 A1 | 12/2013 |
| WO | WO 2019/185298 A1 | 10/2019 |

OTHER PUBLICATIONS

International Preliminary Report on Patentability directed to related International Patent Application No. PCT/EP2020/052244, dated Aug. 25, 2021; 7 pages.

* cited by examiner

STAGE SYSTEM AND LITHOGRAPHIC APPARATUS

CROSS-REFERENCE TO RELATED APPLICATION

The application claims priority of EP application 19159972.9 which was filed on Feb. 28, 2019 which is incorporated herein in its entirely by reference.

FIELD

The present invention relates to a stage system and a lithographic apparatus comprising such stage system.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In a lithographic apparatus a movable stage may be applied, such as a substrate support that holds the substrate or a mask support that holds the mark. An accuracy of positioning of such a stage may translate into a projection accuracy, e.g. an overlay accuracy of the patterns to be projected onto the substrate. The stage may be positioned by a positioner, e.g. comprising one or more actuators. The position of the stage may be controlled making use of one or more position sensors, such as optical position sensors. Examples of such optical position sensors are an interferometer and an encoder. The optical position sensor may make use of a reference, such as a mirror. For example, the interferometer may make use of a reflecting surface onto which an interferometer beam is reflected. For example, a measurement head of the interferometer may be arranged stationary, whereby a distance to a reflecting surface of the stage is measured using the interferometer beam. As another example, a measurement head of an encoder and/or interferometer may be arranged at the stage. A stationary encoder grid may be applied as a reference for the encoder. The encoder grid may form a reflective surface. Likewise, in the case of an interferometer, an interferometer measurement head may be arranged at the stage and may cooperate with a stationary reflective surface to perform position measurement.

SUMMARY

The invention aims to enable a more accurate positioning of the stage.

According to an aspect of the invention, there is provided a stage system comprising
a stage which is movable in respect of a reference structure, wherein one of the stage and the reference structure comprises a reflective surface,
an optical position sensor arranged at the other one of the stage and the reference structure and configured to determine a position of the reflective surface relative to the optical position sensor, and
an optical shape sensor configured to determine a shape of the reflective surface.

According to another aspect of the invention, there is provided a lithographic apparatus comprising such a stage system.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultraviolet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
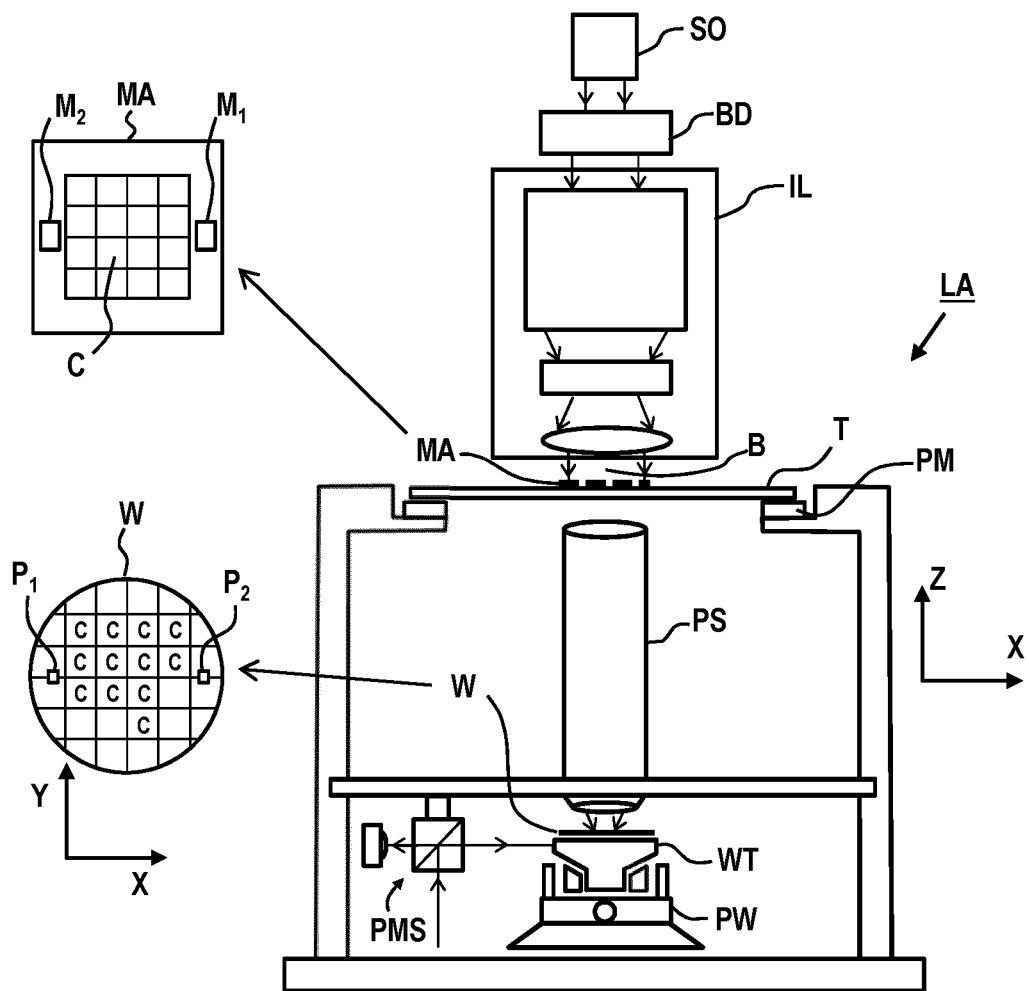
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
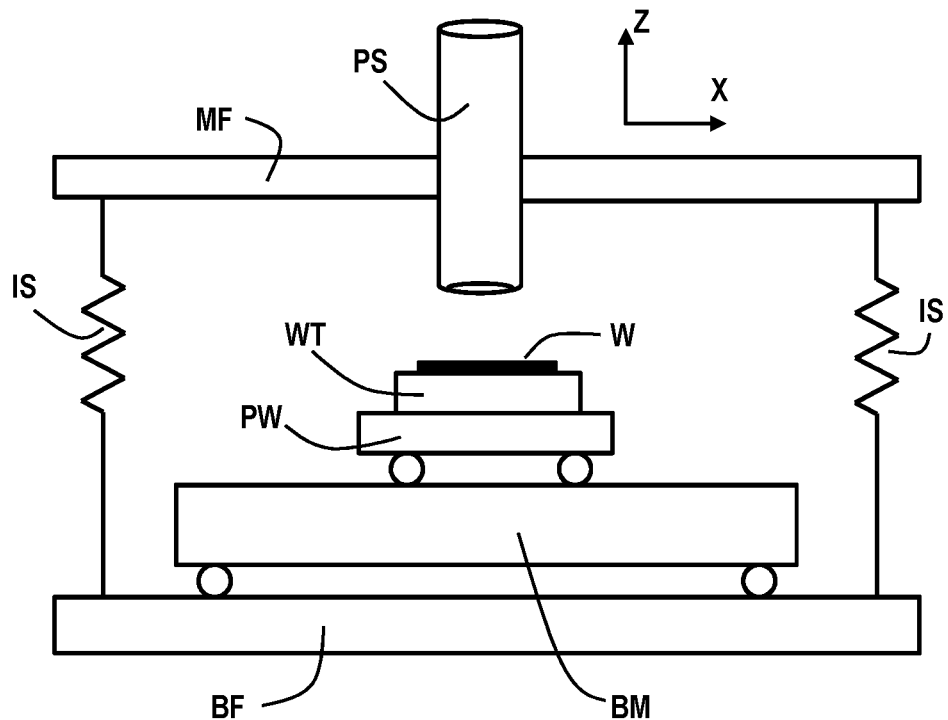
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electro-magnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
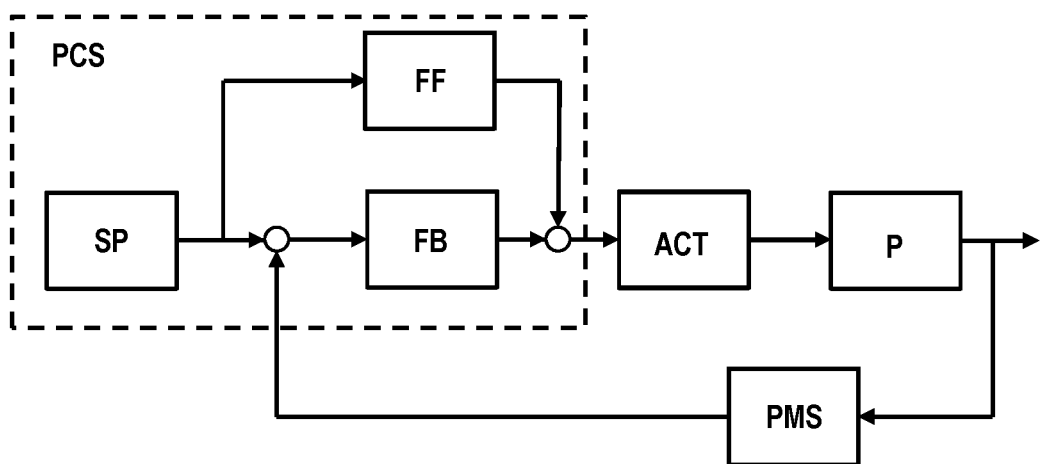
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

According to an aspect of the invention, there is provided a stage system comprising
a stage which is movable in respect of a reference structure, wherein one of the stage and the reference structure comprises a reflective surface,
an optical position sensor arranged at the other one of the stage and the reference structure and configured to determine a position of the reflective surface relative to the optical position sensor, and an optical shape sensor configured to determine a shape of the reflective surface.

The stage may comprise a substrate support of a lithographic apparatus, i.e. a stage configured to support a substrate. The stage may further comprise a mask stage of the lithographic apparatus, i.e. a stage configured to support a patterning device of the lithographic apparatus. The optical position sensor may comprise an interferometer. Alternatively or in addition thereto, the optical position sensor may comprise an encoder. The optical position sensor may make use of a reference, such as a mirror. For example, the interferometer may make use of a reflecting surface onto which an interferometer beam is reflected. For example, a measurement head of the interferometer may be arranged stationary, i.e. at a stationary reference structure, whereby a distance to a reflecting surface of the stage is measured using the interferometer beam. As another example, a measurement head of an encoder and/or interferometer may be arranged at the stage. A position may be measured relative to a stationary reference structure, such as a stationary reflective surface. For example, an encoder grid may be applied as a reference for the encoder. The encoder grid may form a reflective surface. Likewise, in the case of an interferometer, an interferometer measurement head may be arranged at the stage and may cooperate with a stationary reflective surface (i.e. stationary reference structure) to perform position measurement.

As explained above, an accuracy of positioning of the stage may translate into a projection accuracy, e.g. an overlay accuracy of the patterns to be projected onto the substrate. As the position sensor makes use of a reflective surface as a reference, an (in)accuracy of the reference may translate into a position measurement (in)accuracy. For example, in the case of an interferometer, an un-flatness of the reflective surface or a position inaccuracy of the reflective surface may translate into an inaccuracy in the measurement of the position of the stage. As the stage is movable in respect of the reference, an area of incidence of the measurement beam of the optical position sensor may be moved over the reflective surface as the stage moves.

The inventors have devised to provide an optical shape sensor configured to determine a shape of the reflective surface. Once the shape of the reflective surface has been measured, the shape may be taken into account in order to correct the position measurement by the optical position sensor. The shape of the reflective surface may initially deviate from an ideal shape, e.g. due to manufacturing tolerances and/or mounting tolerances of the reflective surface. Further, the shape of the reflective surface may deviate due various other factors, such as dissipation in the stage or other temperature variations resulting in deformation, or due to deformations, e.g. as a result of forces on the stage, movement of the stage, etc. For example, resonant modes of the stage may be excited by an actuation of the stage. Accordingly, a position of the stage may be measured more accurately, as a shape of the reflective surface may be measured, and correspondingly, the shape may be taken into account when determining a position of the stage. The optical shape sensor may for example comprise an interferometer configured to measure a shape of the reflective surface. For example, the optical shape sensor may comprise an interferometer of a grazing incidence type configured to measure a shape of (a part of) the reflective surface. Alternatively or in addition thereto, measurements by the optical shape sensor at various positons of the stage may provide measurements at various areas of incidence on the reflective surface, which may be combined to derive a shape of the reflective surface.

The optical position sensor may for example direct one or more measurement beams to the reflective surface, and derive therefrom a distance towards the reflective surface (e.g. averaging a length of the propagation paths of the measurement beams). The optical shape sensor may direct plural measurement beams to the reflective surface, whereby possible differences in lengths of the propagation paths of the measurement beams reflect a shape of the reflective surface.

In an embodiment, the stage further comprises a position measurement controller configured to: derive a stage position of the stage from the position of the reflective surface relative to the optical position sensor and from the shape of the reflective surface as determined by the optical shape sensor. The position measurement controller may be formed by any suitable control device, such as a suitable programmed microcontroller, microprocessor, etc. The position measurement controller may be formed by a separate controller. Alternatively, the position measurement controller may be comprised in an existing controller of the lithographic apparatus, for example be formed by a program task executed by an existing controller of the lithographic apparatus, such as the position control system PCS as described above. The position measurement controller derives a stage position of the stage from the position of the reflective surface relative to the optical position sensor and from the shape of the reflective surface as determined by the optical shape sensor. In case the shape of the reflective surface would be found to be conform an intended shape, e.g. in case the shape of the reflective surface would be found to be entirely flat, no correction of the distance between a measurement head of the position sensor and the reflective surface would be required. However, any deviations of the shape of the reflective surface, as measured by the optical shape sensor, may be taken into account when determining the position of the stage. The deviations of the shape may for example comprise un-flatness, deformation, etc. Thus, when measuring the position of the stage, the shape of the reflective surface may be taken into account.

Figure 4A:
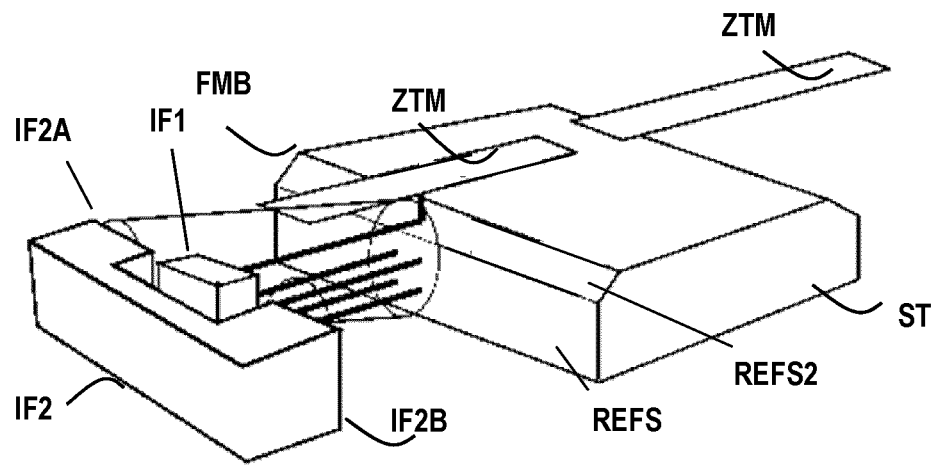
FIGS. 4A and 4B depicts schematic, perspective views of stage systems according to the present disclosure.
Figure 4B:
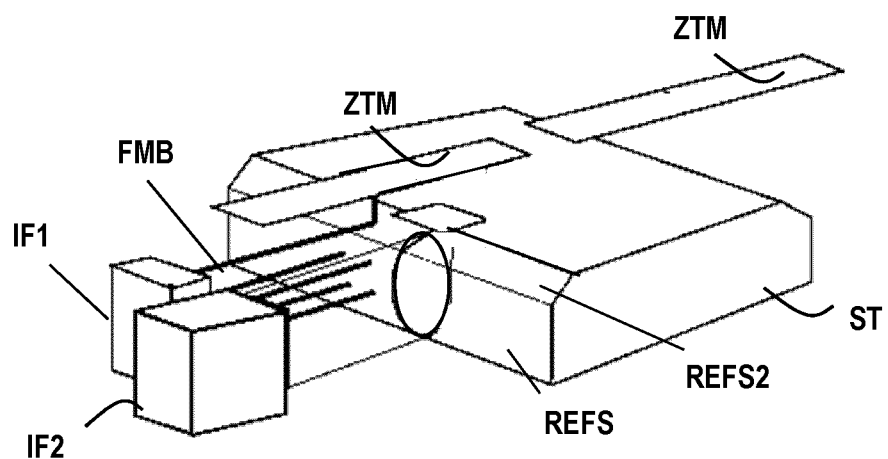

FIGS. 4A and 4B each depict an embodiment of a stage system according to the present development. The stage systems as depicted in FIGS. 4A and 4B each comprise a stage identified as ST. The stage may for example comprise a substrate support WT (not shown) configured to hold a substrate W or a mask support MT (not shown) configured to hold a patterning device M. The stage may be actuated by an actuator, such as actuator ACT as described above. The stage comprises a reflective surface REFS, such as in the present example a reflective mirror. A position sensor, which may form part of the position measurement system PMS as described above, may measure a position relative to the reflective surface. For example, the position sensor may comprise a position interferometer IF1. The interferometer IF1 directs one or more interferometer beams onto the reflective surface in order to determine a distance between the interferometer and the reflective surface. A position of the stage may be derived from the distance as measured by the interferometer IF1.

FIG. 4A depicts an optical shape sensor that comprises shape interferometer IF2. The shape interferometer IF2 comprises measurement heads IF2A and IF2B extending on either side of the displacement interferometer, as seen in a direction along a main plane of movement of the stage. The main plane of movement of the stage being in the present example the horizontal plane. In the embodiment in accordance with FIG. 4A, both the interferometer IF1 and the interferometer IF2 interact with, i.e. reflect onto, a same part of the reflective surface. Thus, the shape of the reflective surface may be measured at the same location on which the position measurement bases.

FIG. 4B depicts another embodiment of the optical shape sensor, namely shape interferometer IF2. The shape interferometer IF2 directs a measurement beam to a part of the reflective surface which is at a distance from the part of the reflective surface onto which the interferometer IF1 directs its measurement beam(s). Accordingly, when comparing the shape interferometer IF2 of FIG. 4B to the shape interferometer IF2 of FIG. 4A, the shape interferometer IF2 according to FIG. 4B may be more compact, while the shape interferometer according to FIG. 4A may direct onto a same area of incidence as the position measurement interferometer IF1, hence allowing to simultaneously measure the shape of the reflective surface at a same part onto which the measurement beam of the interferometer IF1 reflects.

Furthermore, various apertures may be applied: for example, the shape interferometer may be a grazing incidence interferometer configured to measure the reflective surface or a large part thereof at once. Alternatively, a smaller aperture may be applied, whereby results at various locations obtained as the stage moves, are combined using stitching techniques. As another alternative, multiple sub aperture measurements are performed. Again, stitching may be applied to combine sub aperture measurements, for example obtained at various positions of the stage or as the stage moves.

FIGS. 4A and 4B further depict that the stage, in the present embodiment, comprises a further reflective surface REFS2. The further reflective surface extends under an angle of 45 degrees in respect of the reflective surface REFS, as well as under an angle of substantially 45 degrees in respect of the horizontal plane. Further, a horizontal reflective surface is provided, such as the z-target mirror ZTM. The z-target mirror cooperates with the further reflective surface to measure a position of the stage in a vertical direction, as follows: the position interferometer emits a further measurement beam FMB to the further reflective surface, which further measurement beam reflects towards the horizontal reflective surface, and then propagates along a same or similar path back to the interferometer. Accordingly, a vertical position may be measured, as a path length of the path of the further measurement beam may change as the vertical position of the stage changes: In particular, as the z-target mirror may be stationary, a distance between the stage and the z-target mirror may change.

A flatness of the further reflective surface may likewise be determined and taken into account, as described below. Both the optical shape sensors of FIGS. 4A and 4B, namely the respective interferometers IF2 as schematically depicted in FIGS. 4A and 4B, may direct a respective further measurement beam to the further reflective surface in order to determine a flatness thereof. In the configuration in accordance with FIG. 4A, z-target mirror may be applied, as the shape measurement interferometer IF2 directs at substantially a same target area as the interferometer IF1. In the configuration in accordance with FIG. 4B, the further measurement beams of the position interferometer IF1 and the shape interferometer IF2 are directed at areas of incidence on the horizontal a mirror (z-target mirror) which are spaced apart in the direction along a main plane of movement of the stage (in particular along a horizontal direction along the reflective surface).

It will be understood that, although in the examples in FIGS. 4A and 4B the position sensor comprises a displacement interferometer and the optical shape sensor comprises a shape interferometer, other types of optical sensors may be comprised. such as
    an non-interferometric wavefront sensor (i.e. Shack Hartmann wavefront sensor)
    a deflectometric surface shape measurement
    an interferometric wavefront/surface shape sensor:
        Shearing interferometer (derivative of shape sensor)
        Fizeau interferometer/Twymann-Green interferometer/point-diffraction interferometer It is remarked that the shape of the reflective surface may be stored in a memory of the position measurement controller. The position measurement controller being configured to derive the stage position by correcting the initial stage position using the stored shape of the reflective surface at the area of incidence. The stored shape may hence be applied to correct the initial stage position. The stored shape may be derived from previously performed measurements by the optical shape sensor and/or may be pre-stored, e.g. determined in a calibration process.

Figure 5:
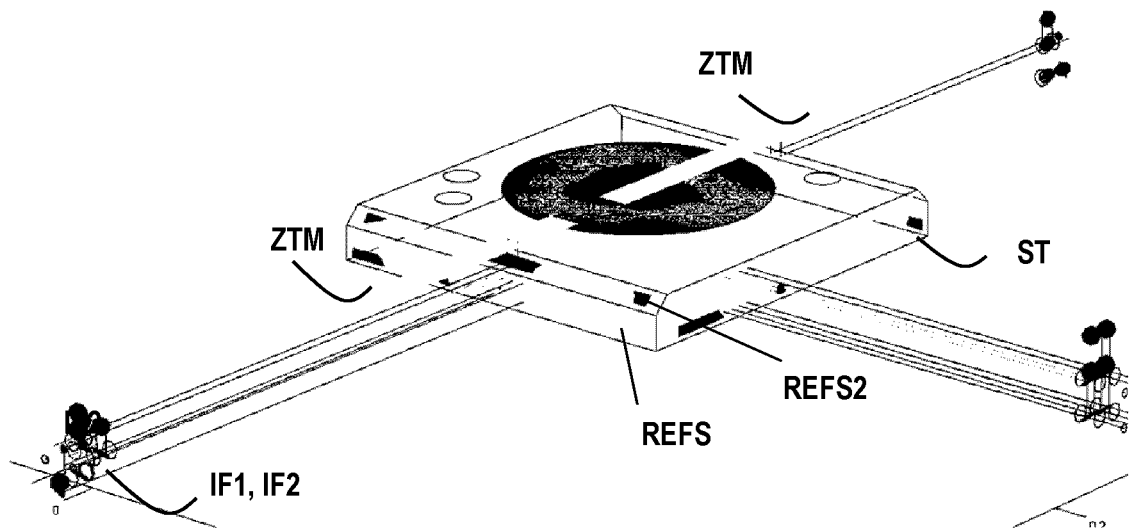
FIG. 5 depicts a schematic, perspective view of a stage systems according to the present disclosure.

FIG. 5 depicts a schematic, perspective view of a ray trace model, in which the stage (in the present example a substrate support WT) and position sensors are depicted. The stage is provided with reflective surfaces at each one of the 4 sides thereof, each one extending substantially vertically. Each side of the stage is further provided with a respective further reflective surface extending under 45 degrees in respect of the respective reflective surface. The reflective surfaces each cooperate with a respective optical position sensor and a respective optical shape sensor. Accordingly, a position and shape of each one of the respective reflective surfaces may be measured. Accordingly, FIG. 5 depicts a complete 9 axis position measurement system, with 3 redundant axes for the measurement of internal chuck deformations.

As the stage moves along the (horizontal) main plane of movement, in respect the position sensors and the shape sensors, the area of incidence of the measurement beams on the reflective surface and the further reflective surface may change. The shape sensor may perform a measurement of a shape of parts of the reflective surface, namely the part at which the respective measurement beam(s) interact with the reflective surface. As the stage moves, different parts of the reflective surface may be measured. Accordingly, the shapes of the parts may be combined to form an overall shape of the reflective surface.

In order to determine a position of the stage, the position measurement controller may proceed as follows: first, an initial stage position is derived from the measurement data obtained from the position sensors, in other words an initial stage position is derived from the position of the reflective surfaces (and possibly the further reflective surfaces) relative to the respective position sensor. Then, from the initial position, an area of incidence on the reflective surface is determined. A shape of the reflective surface is determined from measurement(s) by the shape sensor. The stage position is derived by correcting the initial stage position using the determined shape of the reflective surface at the area of incidence. Thus, a first initial position measurement may be applied to determine at what area of incidence of the reflective surface the beam may be incident. Then, using the determined area of incidence, the shape at that area may either be derived from the previously determined shape of the reflective surface, or may be measured by the shape sensor, e.g. simultaneously with the position measurement. The simultaneous measurement may be able to take account of deformations that affect a shape of the reflective surface taking place at the moment of measurement. Such a simultaneous measurement may be performed using a configuration such as the one depicted in and described with reference to FIG. 4A. Alternatively, the information about internal deformations of the stage is derived from redundant (i.e. overdetermined) position measurement of the stage.

A ray trace model, a result of which being depicted in FIG. 5, may be applied to derive the areas of incidence on the reflective surface(s), hence being able to accurately correlate the initial position with the expected area of incidence.

=> The ray trace model may not only be used to reconstruct the expected area of incidence for the sensors, but it may also (particularly) be used to predict the n-DOF position errors or error sensitivities.

If the stage has less than 6 degrees of freedom (DOF), then the analysis and correction may be limited to n-DOF, where n may be 1, 2, 3, 4, 5 or 6.

(1) The shape sensor(s) may be used to reconstruct the shape of all relevant and/or measurable mirrors.

(2) For a given n-DOF position setpoint, sensor layout and mirrorblock shape, the ray trace model may be used to predict the sensor measurement signals.

(3) A position model may take the simulated measurement signals and reconstructs a n-DOF stage position.

(4) The difference between the setpoint and the reconstructed n-DOF position may be used in a position error correction model.

The position of the stage may be determined, using the output from the position sensor and the output of the shape sensor. Thereby, an initial position as derived from the output of the position sensor may be corrected by a translational correction of the position of the stage. Furthermore, a rotational correction of the position of the stage may be performed, in other words a rotational error may be corrected, e.g. taking the position measurements and shape measurements at the different sides (edges) of the stage into account. Additionally, a tilt of the stage may be determined. The tilt of the stage is to be understood as a tilting of the stage in respect of the x axis or y axis (the x axis and y axis being defined as being orthogonal and as defining the horizontal plane). For example, the optical shape sensor may be employed to measure a shape of the reflective surface or a relevant part thereof. This measurement may be considered a reference, e.g. may be considered to have been performed at a reference tilt position, such as the horizontal position. The vertical position sensing using the horizontally extending z-mirror may for example be employed to confirm or set such horizontal position. Then, knowing the shape of the reflective surface in that (tilted or non-tilted) reference position, a tilting of the stage may result in a tilting of the reflective surface, which may be detected by a shape measurement.

It will be understood that the same or similar measurements of position and shape, as described with reference to FIGS. 4A, 4B and 5 may also be employed in other configurations. For example, instead of the stationary position sensors and shape sensors with associated movable reflective surface mounted to or forming a part of the stage, an inverted arrangement may be applied: for example, the position sensors and the shape sensors may be arranged at the stage, whereby the reflective surfaces may be stationary. In either case, the stationary parts may be mounted to a reference structure of the stage or other a reference structure, such as a metrology frame or other reference frame of a lithographic apparatus.

Various possible embodiments of the shape interferometer will be described below, with reference to the FIGS. 6-11.

Generally, various types of interferometers may be employed for the shape interferometer, such as a Fizeau or Twyman-green configuration or a grating interferometer. An interferometer configuration having a reference surface may be employed, such as a Michelson, Twyman-Green of Fizeau interferometer. Alternatively, an interferometer configuration that is self-referencing may be employed, such as a point diffraction or shearing interferometer. The self-referencing interferometer may allow measurement on axially moving targets. Furthermore, various apertures may be applied: for example, the shape interferometer may be a grazing incidence interferometer configured to measure the reflective surface or a large part thereof at once. Alternatively, a smaller aperture may be applied, whereby results at various locations obtained as the stage moves, are combined using stitching techniques. The interferometer may be a temporal phase shifting, wavelength phase shifting, heterodyne, synthetic heterodyne or instantaneous phase shifting interferometer. In an embodiment, the phase shifting may be provided by movement of the stage, hence enabling to simplify a design of the interferometer.

The position interferometer and shape interferometer may be separate interferometers. Alternatively, the position interferometer and the shape interferometer may be integrated, i.e. merged into a single unit. For example, the position interferometer and the shape interferometer may make use of a common light source, i.e. share a light source.

Figure 6:
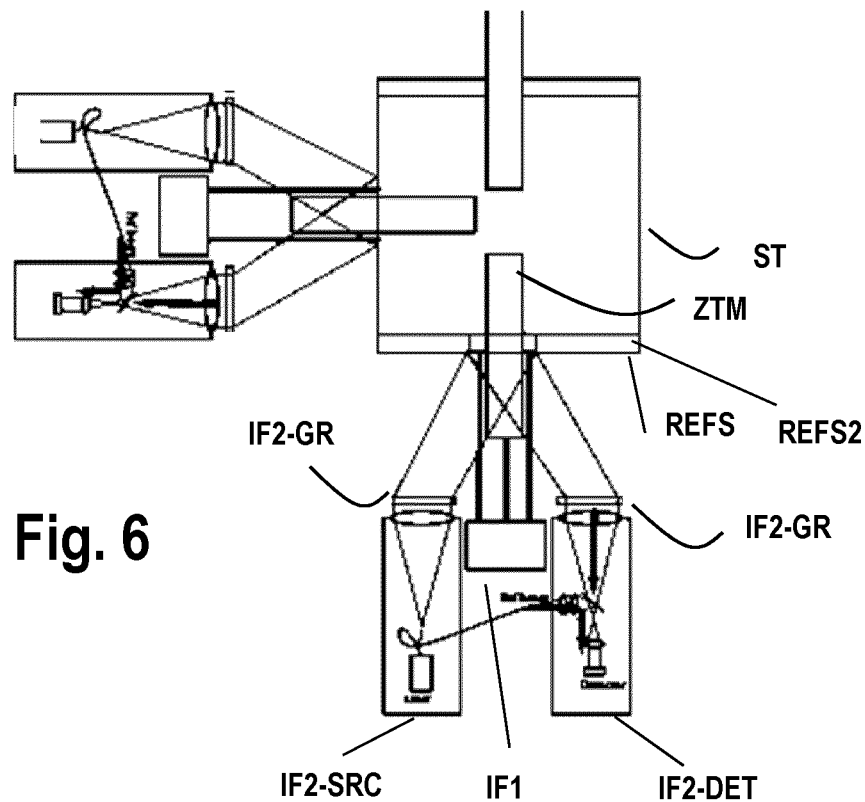
FIG. 6 depicts a schematic, top views of a stage systems according to the present disclosure.

FIG. 6 depicts a top view of a stage ST having reflective surfaces REFS and further reflective surfaces REFS2 arranged at 45 degrees in respect of the reflective surfaces REFS. Position interferometers IF1 measure a position of the reflective surface relative to the interferometer. Shape interferometers IF2 measure a shape of the reflective surface. Z-target mirrors are provided for z-position measurement using the further reflective surfaces to form an associated interferometer beam path as explained above. The shape interferometers may likewise measure a shape of the further reflective surfaces. As described above, the area of incidence of the position interferometer and the shape interferometer overlap, causing the shape interferometer to measure a shape at the same area of the reflective surface and the further reflective surface where the position interferometer beam(s) are reflected. Thus, the shape may be measured virtually at the same moment as the position measurement, enabling to take account of momentary deviations in the shape, such as by torsion modes of the stage, dissipation of the stage etc. The shape interferometer may comprise a IF2-SRC (e.g. comprising a laser source) and a detector IF2-DET, each one of the source and detector being provided with an associated grating IF2-GR in order to deflect the interferometer beam towards the target area on a reflective surface.

Figure 7:
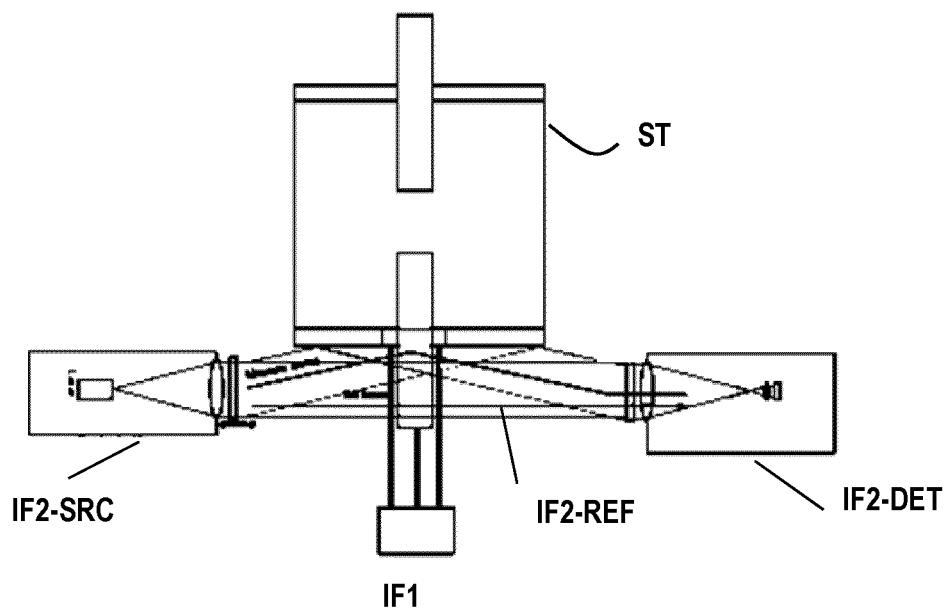
FIG. 7 depicts a schematic, top views of a stage systems according to the present disclosure.

FIG. 7 depicts another embodiment, whereby a grazing incidence type of shape interferometer IF2 is applied. A reference beam IF2-REF may be transmitted from the source to the detector via a direct optical transmission path. The grazing incidence type of interferometer may direct a measurement beam at the reflecting surface (and possibly the further reflective surface) at a grazing incidence and at a relatively large aperture, thus being able to perform a measurement on a relatively large part of the reflective surface (and further reflective surface), or even the entire surface at once. Hence, deviations in the shape of the reflective surface and/or further reflective surface, such as by torsion modes of the stage, dissipation of the stage, etc. may be derived from the instantaneous measurement on the entire reflective surface (or a large part thereof) and accordingly be taken into account to correct the position measurements.

Figure 8:
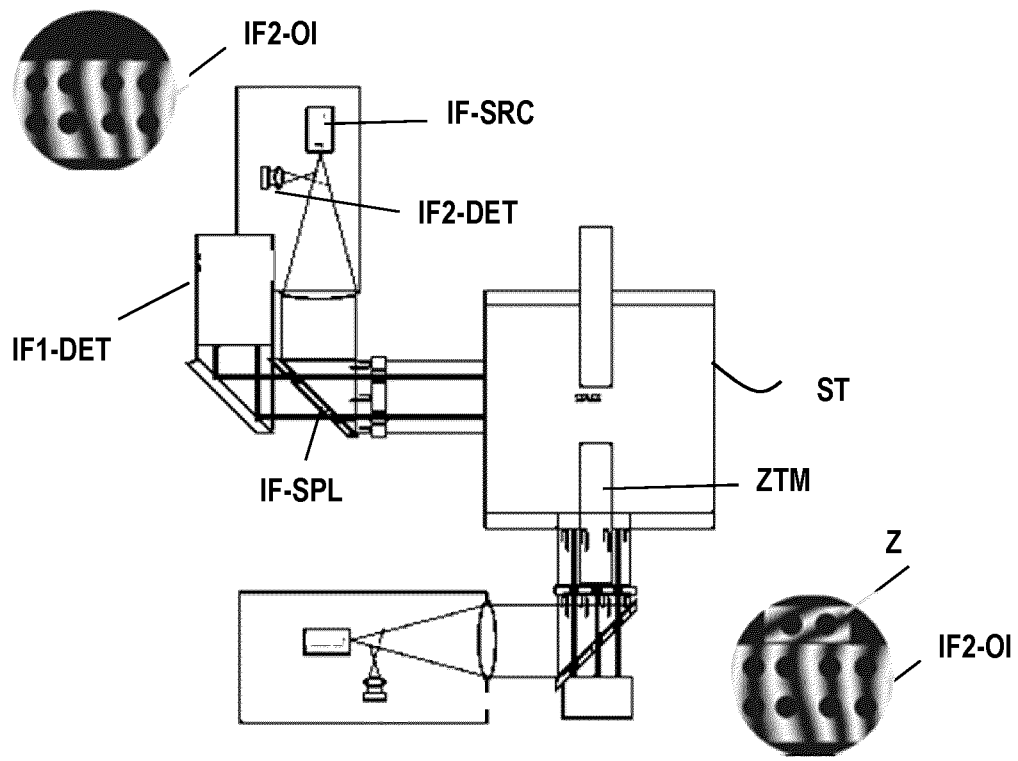
FIG. 8 depicts a schematic, top views of a stage systems according to the present disclosure.

FIG. 8 depicts an example of a merged position and shape interferometer. A common interferometer light source IF-SRC is provided. A beam splitter IF-SPL is provided which is provided with holes, whereby interferometer beams of the position interferometer IF1 pass through the holes of the splitter to be detected by the detector of the position interferometer IF1-DET, while the beam of the shape interferometer is reflected by the beam splitter to be detected by the detector of the shape interferometer IF2-DET to provide output image IF2-OI. The shape interferometer accordingly performs measurements relatively near on the reflective surface to the position measurement. As the stage moves, the interferometers perform measurements at different parts of the reflective surface, the measurements of the shape being combined using stitching techniques. Thus, using the stitching techniques, an obscuration in the shape measurement by the holes in the beam splitter may be addressed making use of the stitching techniques. In case the combined interferometer also projects a beam onto the further reflective surface at 45 degrees and the Z-mirror, as described above, a shape of the further reflective surface may also be imaged, as depicted by the Z part of the output image IF2-OI.

Figure 9:
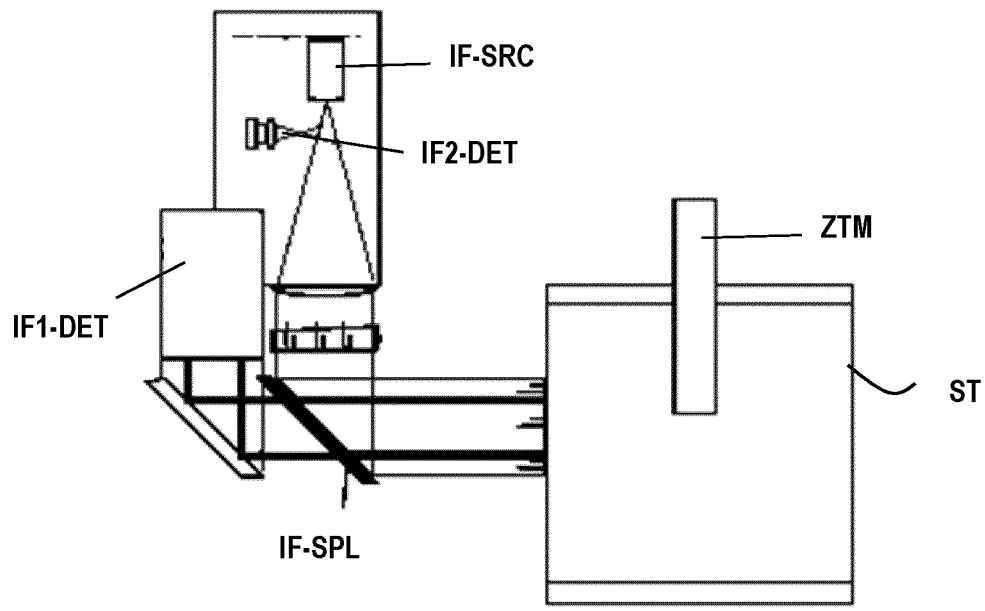
FIG. 9 depicts a schematic, top views of a stage systems according to the present disclosure.

FIG. 9 depicts another example of a top view of a stage and a combined position interferometer and shape interferometer. Again a beam splitter IF-SPL is applied, similarly to the embodiment in accordance with FIG. 8. Instead of the holes in the beam splitter, different wavelengths are applied for the position interferometer and the shape interferometer. Both wavelengths lambda 1 and lambda 2 are emitted by the source IF-SRC, and reflected by the beam splitter onto the reflective surface. The beam splitter forms a dichroic mirror which is reflective for the one wavelength lambda 1 and transmissive for the other wavelength lambda 2, causing the position interferometer beam at wavelength lambda 1 to be reflected by the beam splitter and to propagate to the detector IF1-DEt of the position interferometer. The dichroic mirror is transmissive for the wavelength lambda 2, causing the shape interferometer beam at wavelength lambda 2 to pass the beam splitter propagate to the detector IF1-DEt of the position interferometer. The obscuration in the shape measurement, as may result from the holes in the beam splitter in accordance with FIG. 8, may be avoided by the dual wavelength approach.

The shape sensor may also be integrated with the displacement sensor such that a part of the detection light of the displacement sensor (typically having an aperture on the order of 6-10 mm) is split via a beamsplitter and guided towards a wavefront shape sensor. Then, the wavefront shape sensor may exactly measure the wavefront shape of the mirrorblock "as observed by the displacement sensor".

Figure 10:
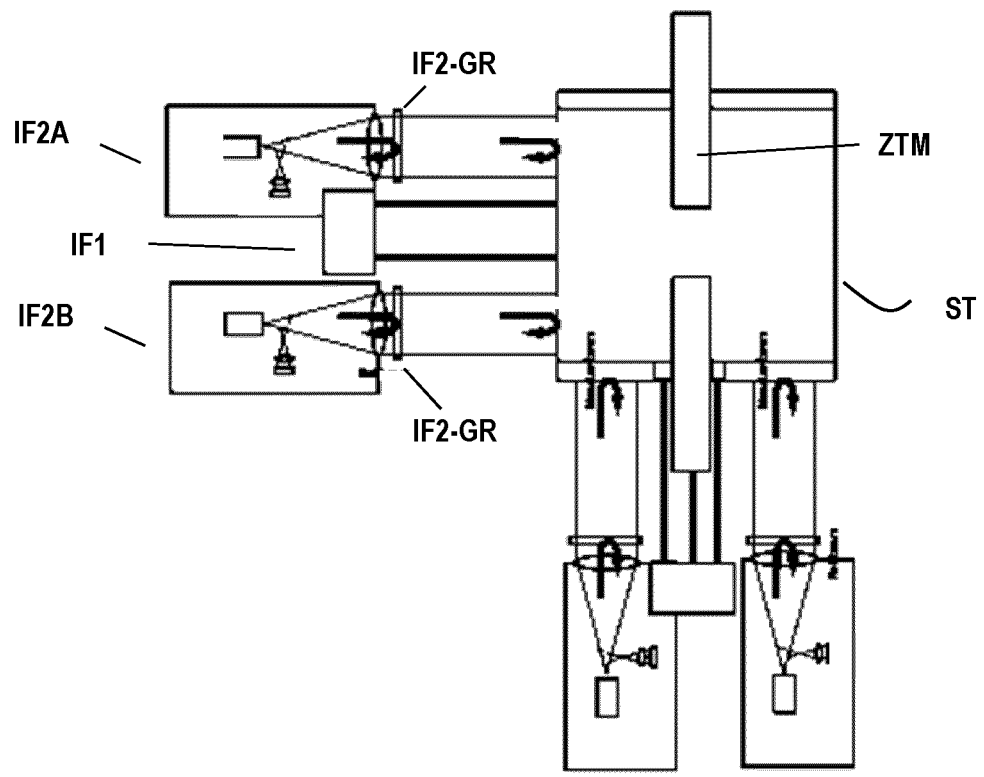
FIG. 10 depicts a schematic, top views of a stage systems according to the present disclosure.

FIG. 10 depicts yet another example of a top view of a stage, a position interferometer IF1 and a shape interferometer IF2. Dual shape interferometers IF2A, IF2B, are provided to cooperate with the same reflective surface of the stage, the dual shape interferometers being provided (seen in the horizontal plane) on both sides of the position interferometer IF1. In the present embodiment, the shape interferometers are provided with grating IF2-GR, which reflect a reference beam back to the detector, while a measurement beam passes through the grating and being reflected by the reflective surface. As shown in FIG. 10, the shape interferometers, in the present embodiment, interact with parts of the reflective surface which are on respective sides adjacent to the part where the position interferometer beam(s) reflect on the reflective surface. A reconstruction of a shape of the entire reflective surface may be performed by movement of the stage an combining multiple (aperture) measurements.

Figure 11:
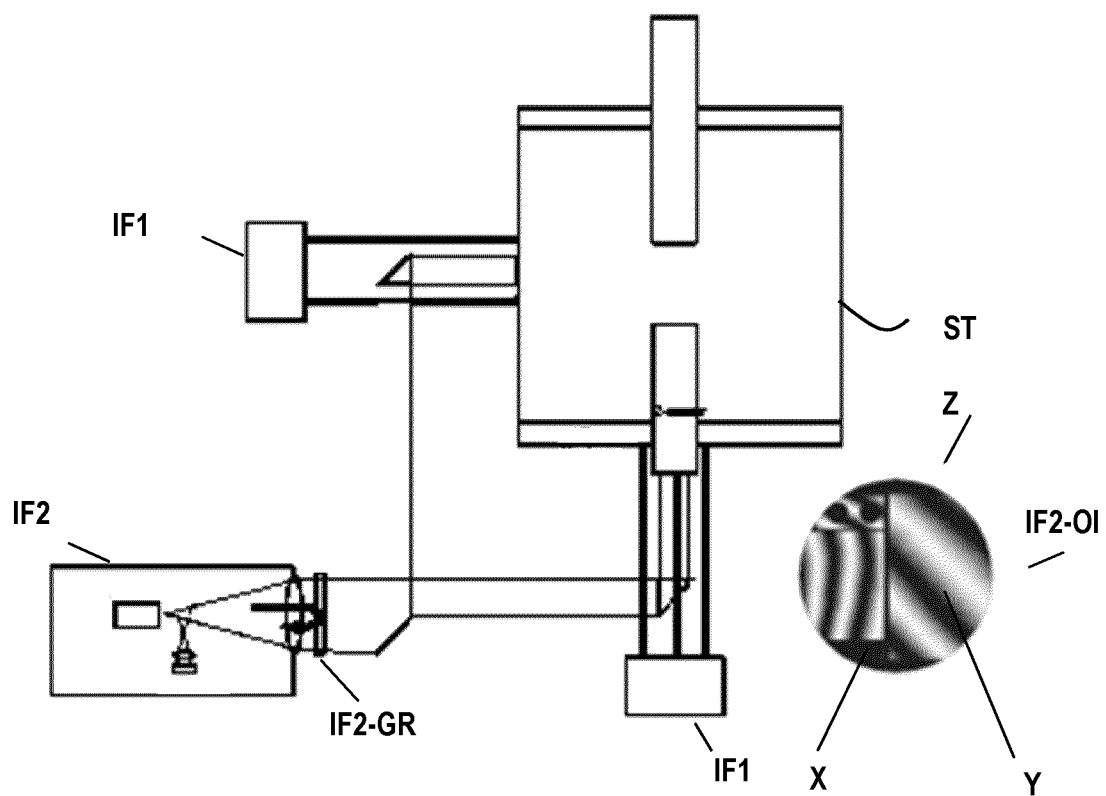
FIG. 11 depicts a schematic, top views of a stage systems according to the present disclosure.

FIG. 11 depicts a yet further example of a top view of a stage, position interferometers IF1 and shape interferometers IF2 The sides of the stage are provided with reflective position interferometers in order to be able to derive an X and Z respectively an Y and Z position of the stage. A beam of shape interferometer IF2 is split by a splitter into dual beams, each one interacting with a respective one of the reflective surfaces of the stage. Hence an output image IF2-OI of the shape interferometer, comprises respective parts associated with the X shape measurement and Y shape measurement, whereby a further part of the output image may be associated with the measurement on the further reflective surface(s) using the associated z-mirror.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The present invention may also be described by the following clauses:

1. A stage system comprising
a stage which is movable in respect of a reference structure, wherein one of the stage and the reference structure comprises a reflective surface, an optical position sensor arranged at the other one of the stage and the reference structure and configured to determine a position of the reflective surface relative to the optical position sensor, and an optical shape sensor configured to determine a shape of the reflective surface.

2. The stage system according to clause 1, further comprising a position measurement controller configured to:

derive a stage position of the stage from the position of the reflective surface relative to the optical position sensor and from the shape of the reflective surface as determined by the optical shape sensor.

3. The stage system according to clause 1 or 2, wherein the position measurement controller is configured to:

derive an initial stage position of the stage from the determined position of the reflective surface relative to the optical position sensor;

derive from the initial stage position an area of incidence of an optical beam of the optical position sensor on the reflective surface, and derive the stage position by correcting the initial stage position using the shape of the reflective surface at the area of incidence.

4. The stage system according to clause 3, wherein the area of incidence is derived using a ray trace model.

5. The stage system according to any one of clauses 3 or 4, wherein the correcting the initial stage position using the shape of the reflective surface at the area of incidence comprises performing a translational correction.

6. The stage system according to any one of clauses 3-5, wherein the correcting the initial stage position using the shape of the reflective surface at the area of incidence comprises performing a rotational correction.

7. The stage system according to any one of clauses 2-6, wherein the position measurement controller is configured to derive a tilt of the stage from a comparison of a further measurement by the optical shape sensor with the determined shape of the reflective surface.

8. The stage system according to any one of clauses 3-7, wherein a shape of the reflective surface is stored in a memory of the position measurement controller, the position measurement controller being configured to derive the stage position by correcting the initial stage position using the stored shape of the reflective surface at the area of incidence.

9. The stage system according to any one of the preceding clauses, wherein the optical position sensor is configured to direct a position measurement beam at a position measurement beam area of incidence of the reflective surface, and wherein the optical shape sensor is configured to direct a shape measurement beam at a shape measurement beam area of incidence, and wherein the position measurement beam area of incidence and the shape measurement beam area of incidence overlap.

10. The stage system according to clause 9, wherein the stage further comprising a further reflective surface extending under 45 degrees in respect of a main plane of movement of the stage, the optical position sensor comprising a position sensor target mirror extending substantially parallel to the main plane of movement of the stage, wherein the optical position sensor and the optical shape sensor are configured to project a respective further measurement beam onto overlapping respective further areas of incidence on the further reflective surface.

11. The stage system according to any one of clauses 1-8, wherein the optical position sensor is configured to direct a position measurement beam at a position measurement beam area of incidence of the reflective surface, and wherein the optical shape sensor is configured to direct a shape measurement beam at a shape measurement beam area of incidence, and wherein the position measurement beam area of incidence and the shape measurement beam area of incidence are mutually spaced apart in a direction along a main plane of movement of the stage.

12. The stage system according to clause 11, wherein the stage further comprising a further reflective surface extending under 45 degrees in respect of a main plane of movement of the stage, the optical position sensor comprising a position sensor target mirror extending substantially parallel to the main plane of movement of the stage, wherein the optical position sensor and the optical shape sensor are configured to project a respective further measurement beam onto respective further areas of incidence on the further reflective surface which are mutually spaced apart in the direction along a main plane of movement of the stage.

13. The stage system according to any one of the preceding clauses, wherein the optical position sensor comprises a displacement interferometer and/or wherein the optical shape sensor comprises a shape interferometer.

14. The stage system according to any one of the preceding clauses, wherein the optical shape sensor comprises a grazing incidence interferometer.

15. The stage system according to any one of the preceding clauses, wherein the optical shape sensor comprises a deflectometer.

16. The stage system according to any one of the preceding clauses, wherein the optical shape sensor comprises a wavefront sensor.

17. The stage system according to any one of the preceding clauses, wherein the optical position sensor and the optical shape sensor comprise a common light source, the stage system comprising a beam splitter provided with at least one hole for passing a respective beam of the optical position sensor.

18. The stage system according to any one of the preceding clauses, wherein the optical position sensor and the optical shape sensor comprise a common light source configured to emit a first and a second wavelength, the stage system comprising a dichroic beam splitter configured to reflect light at the first wavelengths and to transmit light at the second wavelengths, wherein the optical position sensor is arranged to receive one of the first and second wavelengths and the optical shape sensor is arranged to receive the other one of the first and second wavelengths.

19. The stage system according to any one of the preceding clauses, wherein the optical shape sensor comprises a splitter to split an optical shape measurement beam into a first part to interact with a the reflective surface of the stage and a second part to interact with another reflective surface of the stage.

20. A lithographic apparatus comprising the stage system according to any one of the preceding clauses.

21. The lithographic apparatus according to clause 20, wherein the stage system is one of a substrate support configured to hold a substrate and a mask support configured to hold a patterning device.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

What is claimed is:

1. A stage system comprising:
   a stage configured to be movable with respect to a reference structure, wherein one of the stage and the reference structure comprises a reflective surface;
   an optical position sensor arranged at one of the stage and the reference structure not having the reflective surface and configured to determine a position of the reflective surface relative to the optical position sensor; and
   an optical shape sensor configured to determine a shape of the reflective surface,
   wherein the optical position sensor is configured to direct a position measurement beam at a position measurement beam area of incidence of the reflective surface,
   wherein the optical shape sensor is configured to direct a shape measurement beam at a shape measurement beam area of incidence of the reflective surface, and
   wherein the position measurement beam area of incidence and the shape measurement beam area of incidence overlap.

2. The stage system of claim 1, further comprising a position measurement controller configured to:
   derive a stage position of the stage from the position of the reflective surface relative to the optical position sensor and from the shape of the reflective surface as determined by the optical shape sensor.

3. The stage system of claim 2, wherein the position measurement controller is configured to derive a tilt of the stage from a comparison of a further measurement by the optical shape sensor with the determined shape of the reflective surface.

4. The stage system of claim 1, wherein a position measurement controller is configured to:
   derive an initial stage position of the stage from the position of the reflective surface relative to the optical position sensor;
   derive, from the initial stage position, an area of incidence of an optical beam of the optical position sensor on the reflective surface; and
   derive the stage position by correcting the initial stage position using the shape of the reflective surface at the area of incidence.

5. The stage system of claim 4, wherein the area of incidence is derived using a ray trace model.

6. The stage system of claim 4, wherein the correcting the initial stage position using the shape of the reflective surface at the area of incidence comprises performing a translational correction.

7. The stage system of claim 4, wherein the correcting the initial stage position using the shape of the reflective surface at the area of incidence comprises performing a rotational correction.

8. The stage system of claim 4, wherein the shape of the reflective surface is stored in a memory of the position measurement controller, the position measurement controller being configured to derive the stage position by correcting the initial stage position using the stored shape of the reflective surface at the area of incidence.

9. The stage system of claim 1, wherein the stage further comprises:
   a further reflective surface extending under 45 degrees in respect of a main plane of movement of the stage,
   wherein the optical position sensor comprises a position sensor target mirror extending substantially parallel to the main plane of movement of the stage, and
   wherein the optical position sensor and the optical shape sensor are configured to project a respective further measurement beam onto overlapping respective further areas of incidence on the further reflective surface.

10. The stage system of claim 1, wherein:
    the optical position sensor comprises a displacement interferometer and/or
    the optical shape sensor comprises a shape interferometer.

11. The stage system of claim 1, wherein the optical shape sensor comprises a grazing incidence interferometer.

12. The stage system of claim 1, wherein the optical shape sensor comprises a deflectometer.

13. The stage system of claim 1, wherein the optical shape sensor comprises a wavefront sensor.

14. The stage system of claim 1, wherein:
    the optical position sensor and the optical shape sensor comprise a common light source, and
    the stage system comprises a beam splitter provided with at least one hole for passing a respective beam of the optical position sensor.

15. The stage system of claim 1, wherein:
    the optical position sensor and the optical shape sensor comprise a common light source configured to emit a first and a second wavelength,
    the stage system comprises a dichroic beam splitter configured to reflect light at the first wavelengths and to transmit light at the second wavelengths,
    the optical position sensor is arranged to receive one of the first and second wavelengths, and
    the optical shape sensor is arranged to receive another one of the first and second wavelengths.

16. The stage system of claim 1, wherein the optical shape sensor comprises a splitter configured to split an optical shape measurement beam into a first part to interact with the reflective surface of the stage and a second part to interact with another reflective surface of the stage.

17. A lithographic apparatus comprising a stage system comprising:
    a stage configured to be movable with respect to a reference structure, wherein one of the stage and the reference structure comprises a reflective surface;

an optical position sensor arranged at one of the stage and the reference structure not having the reflective surface and configured to determine a position of the reflective surface relative to the optical position sensor; and an optical shape sensor configured to determine a shape of the reflective surface, wherein the optical position sensor is configured to direct a position measurement beam at a position measurement beam area of incidence of the reflective surface, wherein the optical shape sensor is configured to direct a shape measurement beam at a shape measurement beam area of incidence of the reflective surface, and wherein the position measurement beam area of incidence and the shape measurement beam area of incidence overlap.

18. The lithographic apparatus of claim 17, wherein the stage system is one of a substrate support configured to hold a substrate and a mask support configured to hold a patterning device.

* * * * *